(12) United States Patent
Xie et al.

(10) Patent No.: US 9,954,104 B2
(45) Date of Patent: Apr. 24, 2018

(54) MULTIWIDTH FINFET WITH CHANNEL CLADDING

(71) Applicant: GLOBALFOUNDRIES Inc., Grand Cayman (KY)

(72) Inventors: Ruilong Xie, Niskayuna, NY (US); Ajey Poovannummoottil Jacob, Watervliet, NY (US)

( * ) Notice: Subject to any disclaimer, the term of this patent is extended or adjusted under 35 U.S.C. 154(b) by 412 days.

(21) Appl. No.: 14/162,948

(22) Filed: Jan. 24, 2014

(65) Prior Publication Data

US 2015/0214365 A1 Jul. 30, 2015

(51) Int. Cl.
| | |
|---|---|
| *H01L 27/08* | (2006.01) |
| *H01L 29/78* | (2006.01) |
| *H01L 29/66* | (2006.01) |
| *H01L 29/20* | (2006.01) |
| *H01L 29/161* | (2006.01) |
| *H01L 21/8238* | (2006.01) |
| *H01L 27/092* | (2006.01) |
| *H01L 21/84* | (2006.01) |
| *H01L 27/12* | (2006.01) |
| *H01L 29/10* | (2006.01) |

(52) U.S. Cl.
CPC .. *H01L 29/7842* (2013.01); *H01L 21/823807* (2013.01); *H01L 21/823821* (2013.01); *H01L 21/845* (2013.01); *H01L 27/0924* (2013.01); *H01L 27/1211* (2013.01); *H01L 29/1054* (2013.01); *H01L 29/161* (2013.01); *H01L 29/20* (2013.01); *H01L 29/66795* (2013.01); *H01L 29/785* (2013.01)

(58) Field of Classification Search
CPC .................................................. H01L 29/7842
USPC ........................................................ 257/401
See application file for complete search history.

(56) References Cited

U.S. PATENT DOCUMENTS

| | | | |
|---|---|---|---|
| 7,202,494 B2 | 4/2007 | Blanchard et al. | |
| 9,653,584 B2 * | 5/2017 | Glass | H01L 29/66818 |
| 2004/0217430 A1 * | 11/2004 | Chu | H01L 21/2807 257/410 |
| 2007/0111419 A1 * | 5/2007 | Doyle | H01L 21/823807 438/197 |
| 2013/0175620 A1 | 7/2013 | Cai et al. | |
| 2013/0221448 A1 * | 8/2013 | Chang | H01L 29/06 257/401 |
| 2014/0151819 A1 * | 6/2014 | Cheng | H01L 21/28255 257/411 |
| 2014/0346607 A1 * | 11/2014 | Ching | H01L 29/66795 257/369 |

FOREIGN PATENT DOCUMENTS

WO    WO 2015099680 A1 *  7/2015  ....... H01L 29/66795

* cited by examiner

*Primary Examiner* — Ajay K Arora
(74) *Attorney, Agent, or Firm* — Williams Morgan, P.C.

(57) ABSTRACT

An improved structure and methods of fabrication for fin-FET devices utilizing a cladding channel are disclosed. A staircase fin is formed where the fin comprises an upper portion of a first width and a lower portion of a second width, wherein the lower portion is wider than the upper portion. The narrower upper portion allows the cladding channel to be deposited and still have sufficient space for proper gate deposition, while the lower portion is wide to provide improved mechanical stability, which protects the fins during the subsequent processing steps.

12 Claims, 14 Drawing Sheets

MULTIWIDTH FINFET WITH CHANNEL CLADDING

FIELD OF THE INVENTION

The present invention relates generally to semiconductor fabrication, and more particularly to a multi-width fin type field effect transistor with channel cladding.

BACKGROUND

As integrated circuits continue to scale downward in size, the finFET (fin type field effect transistor) is becoming an attractive device for use with modern semiconductor devices. In a finFET, the channel is traditionally formed by a semiconductor vertical fin (as compared with a planar channel in a conventional CMOS), and a gate electrode is located and wrapped around the fin. With finFETs, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called Ge, SiGe, or III-V materials, to manufacture FinFET devices, which are intended to enhance the performance capabilities of such devices, e.g., to enable low-voltage operation.

One prior art process that has been employed to form alternative fin materials on silicon substrate fins is simply to perform an etch process on a substrate through a patterned hard mask layer to form a plurality of trenches in the substrate. As before, this etching process results in the definition of a plurality of substrate fins. Then, a layer of insulating material is formed in the trenches of the device such that it overfills the trenches. Next, an etching process, such as a dry, wet or vapor phase etching process, is performed to reduce the thickness of the layer of the insulating material, and this process essentially defines the final fin height of the fins. Then, a layer of alternative semiconductor material is formed on the exposed portions of the substrate fins by performing an epitaxial deposition process (referred to as a "cladding" channel formation). Then, a gate structure, either a permanent gate structure or a sacrificial gate structure would be formed on the fins using traditional techniques.

A drawback of the prior art is that the final fin width (initial fin width+twice of the cladding thickness) is too large, such that it limits the scaling of the fin pitch to maximize the channel width under fixed footprint. It is therefore desirable to have improvements in the fabrication of finFETs having a cladding channel.

SUMMARY

In an aspect, embodiments of the present invention provide a semiconductor structure having: a semiconductor substrate which has a plurality of fins formed thereon, wherein at least one fin of the plurality of fins is composed of a lower portion and an upper portion, wherein the lower portion has a first thickness and wherein the upper portion has a second thickness, and wherein the first thickness is greater than the second thickness, and wherein the at least one fin has a staircase profile.

In another aspect, embodiments of the present invention provide a semiconductor structure having: a semiconductor substrate which has a plurality of NFET fins formed thereon and a plurality of PFET fins formed thereon, wherein each fin of the plurality of PFET fins is composed of a lower portion and an upper portion, wherein the lower portion has a first thickness and wherein the upper portion has a second thickness, and wherein the first thickness is greater than the second thickness.

In still yet another aspect, embodiments of the present invention provide a method of forming a semiconductor structure, the steps being: forming an upper portion of a first set of fins; forming hardmask material regions over the upper portion of the first set of fins; forming a lower portion of the first set of fins; depositing a dielectric layer over the first set of fins; recessing the dielectric layer to expose the upper portion of the first set of fins; and forming a first conformal cladding channel on the upper portion of the first set of fins.

BRIEF DESCRIPTION OF THE DRAWINGS

The accompanying drawings, which are incorporated in and constitute a part of this specification, illustrate several embodiments of the present teachings and together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

DETAILED DESCRIPTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments of the present invention provide an improved structure and methods of fabrication for finFET devices utilizing a cladding channel. A staircase fin is formed where the fin comprises an upper portion of a first width and a lower portion of a second width, wherein the lower portion is wider than the upper portion. The narrower upper portion allows the cladding channel to be deposited and still have sufficient space for proper gate deposition, while the lower portion is wide to provide improved mechanical stability, which protects the fins during the subsequent processing steps, thereby improving product yield.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments", "in some embodiments", and similar language throughout this specification may, but do not necessarily, all refer to the same embodiment.

The terms "overlying" or "atop", "positioned on, "positioned atop", or "disposed on", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

Figure 1:
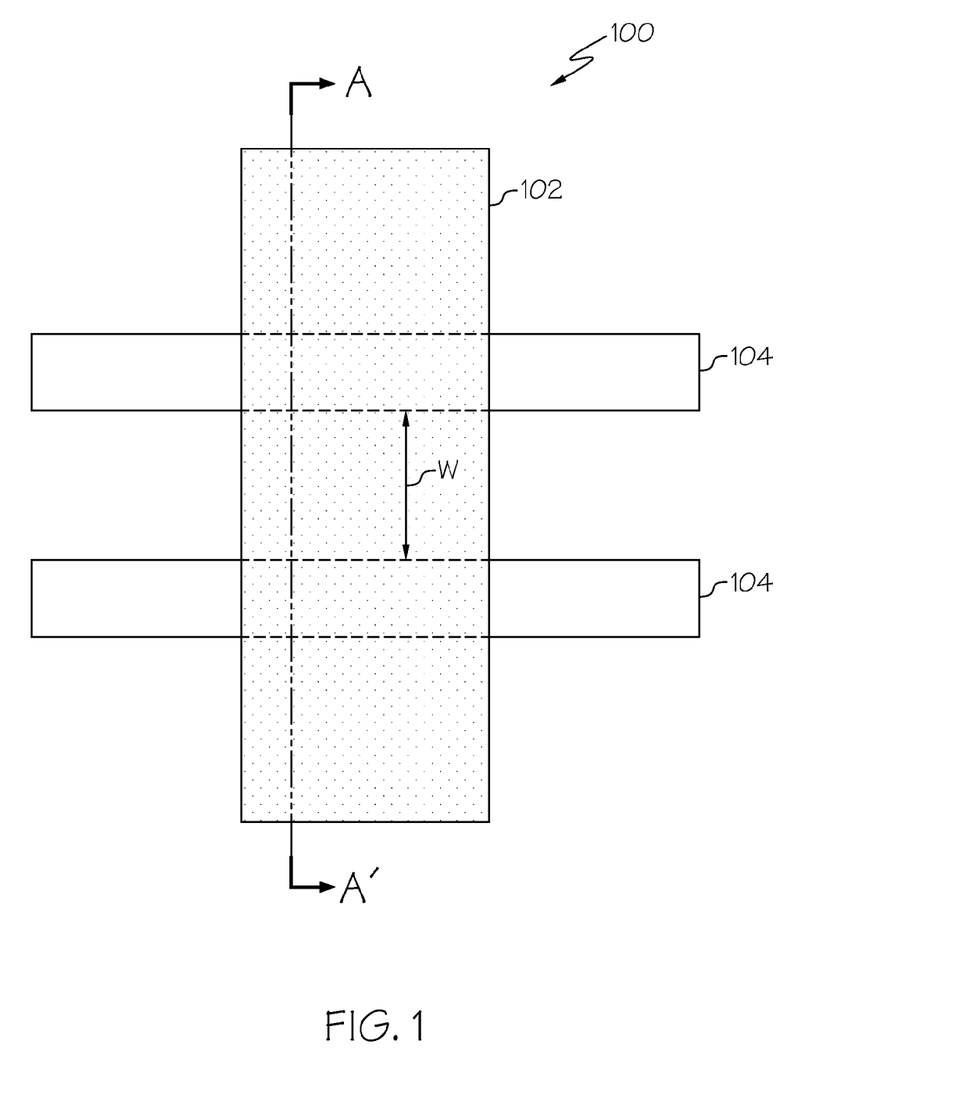
FIG. 1 is a top-down view of a finFET in accordance with embodiments of the present invention.

FIG. 1 is a top-down view of a finFET 100 in accordance with embodiments of the present invention. As shown, there is a gate 102 over two fins 104. The fins 104 have a gap distance W between them. For increased circuit density, it is desirable to have W small, but as the distance W gets small, depositing the gate 102 such that it consistently fills the gap between the two fins becomes challenging. The challenge is even greater when a cladding channel is used, as the cladding channel can serve to effectively reduce the distance W, hence making it even harder to fill the gap between the fins. Embodiments of the present invention address this problem such that even with a cladding channel, the gate material can be uniformly deposited in the gap between the fins.

Figure 2:
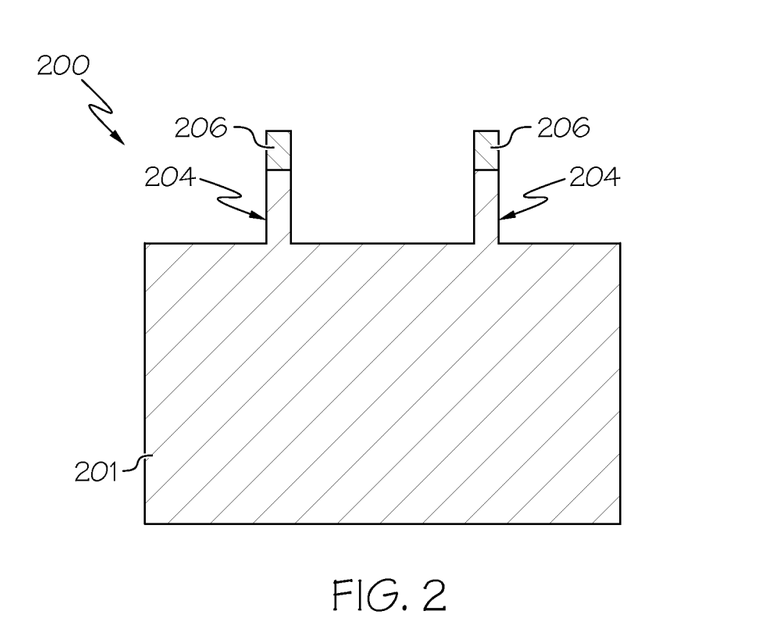
FIG. 2 is a semiconductor structure at a starting point for embodiments of the present invention.

FIG. 2 is a semiconductor structure 200 viewed along A-A' of FIG. 1, with no gate 102 present. Semiconductor structure 200 comprises a semiconductor substrate 201, which may, in some embodiments, be a bulk silicon substrate, such as a silicon wafer. In other embodiments, semiconductor substrate 201 is comprised of a silicon-on-insulator (SOI) substrate. Fins 204 are partially etched shown as formed in the semiconductor substrate 201, and having a hardmask 206 deposited thereon. The hardmask 206 may be nitride or any other suitable material. The hardmask 206 may be blanket deposited prior to forming the fins 204. Fins 204 may be formed with an industry standard process such as etch or SIT (sidewall image transfer) and/or any other suitable technique now known or hereafter developed. Embodiments of the present invention may be integrated into a replacement metal gate process, either prior to the deposition of a dummy polysilicon gate, or after removal of the dummy poly gate but before deposition of the metal gate.

Figure 3:
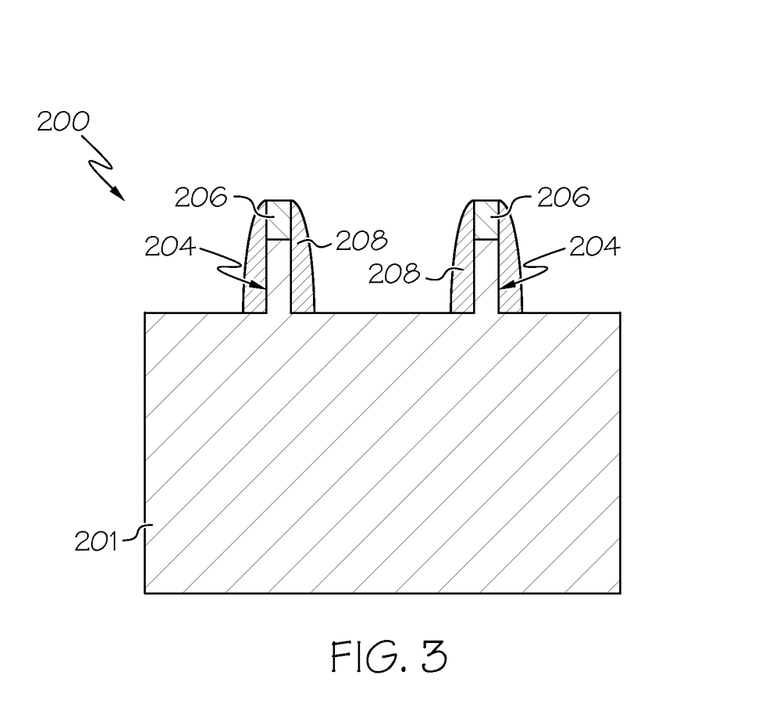
FIG. 3 is a semiconductor structure after a subsequent process step of spacer formation.

FIG. 3 is the semiconductor structure 200 after a subsequent process step of spacer formation. The spacers 208 may be formed by industry standard processes. Spacers 208 may be comprised of silicon nitride, silicon oxide, any other suitable material, or a combination of layers of each.

Figure 4:
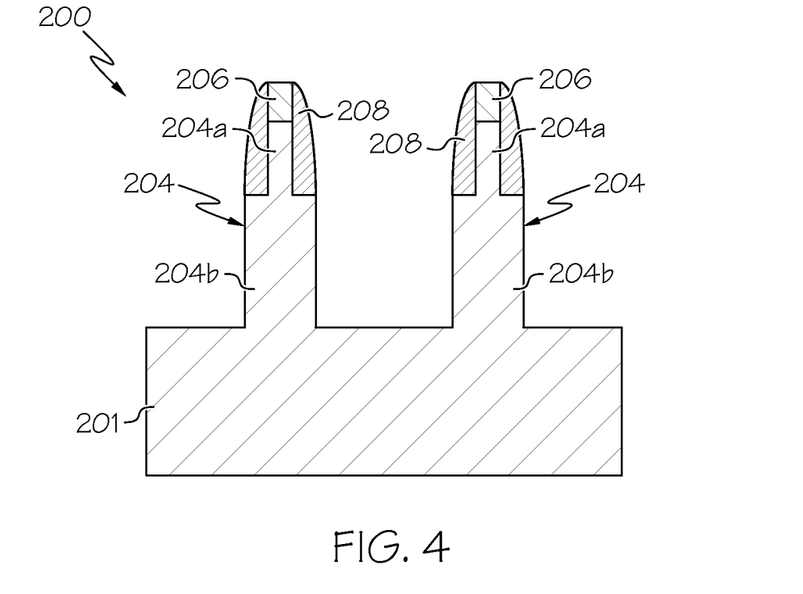
FIG. 4 is a semiconductor structure after a subsequent process step of performing a fin etch.

FIG. 4 is the semiconductor structure 200 after a subsequent process step of performing a fin etch. In some embodiments, this is an anisotropic etch, such as a reactive ion etch (RIE), and/or any other suitable technique now known or hereafter developed. As a result of the fin etch, each fin 204 now comprises an upper portion 204a, and a lower portion 204b, wherein the lower portion 204b is wider than the upper portion 204a.

Figure 5:
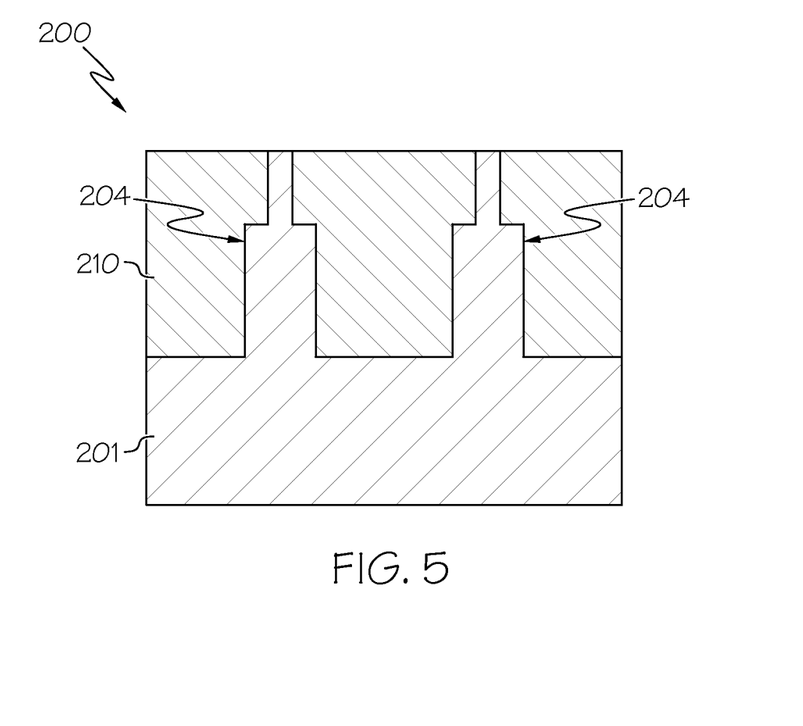
FIG. 5 is a semiconductor structure after a subsequent process step of depositing a dielectric layer.

FIG. 5 is a semiconductor structure 200 after a subsequent process step of depositing a dielectric layer (ILD) 210. In some embodiments, the hard mask 206 and spacers 208 are removed. The ILD 210 is then deposited, followed by planarization to a level of the top of the fins 204. Planarization may be achieved by a chemical mechanical polish (CMP), or any other suitable technique now known or hereafter developed.

Figure 6:
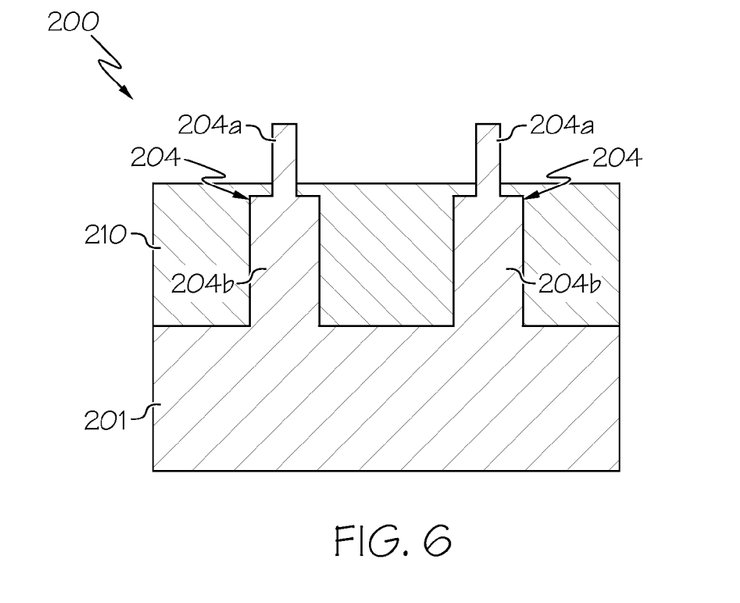
FIG. 6 is a semiconductor structure after a subsequent process step of recessing the dielectric layer.

FIG. 6 is the semiconductor structure 200 after a subsequent process step of recessing the dielectric layer 210. The recessing may be achieved by a selective etch process, such as chemical oxide removal (COR), wet etch, RIE, or any other suitable technique, now known or hereafter developed. As a result of the recess, the upper portion 204a of the fins 204 is exposed.

Figure 7:
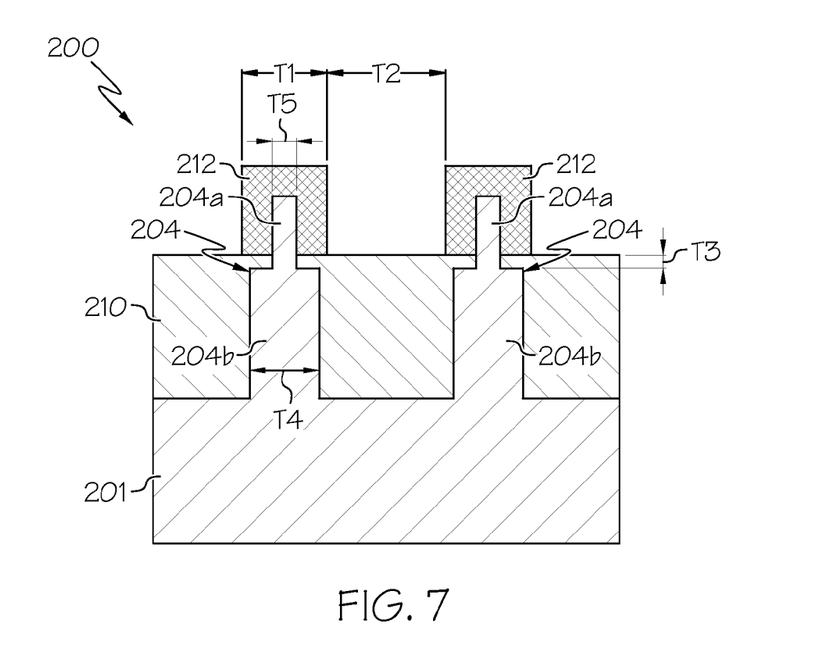
FIG. 7 is a semiconductor structure in accordance with embodiments of the present invention.

FIG. 7 is the semiconductor structure 200 in accordance with some embodiments of the present invention. Fins 204 are "staircase" or "multi-width" fins, where a lower portion 204b thereof has a first width that is constant, and is wider than the a constant width of the upper portion 204a, i.e. T4>T5. Therefore, fins 204 may have a staircase profile. A cladding channel 212 may be deposited by a selective epitaxial growth (SEG) process, or any other suitable process now known or hereafter developed, over the upper portion 204a of fins 204. Distance T3 (which may range from about 3 nanometers to about 10 nanometers) is provided to maintain isolation between cladding channel 212, which is a conformal cladding layer, and the lower portion 204b of each fin 204. Hence, the dielectric layer 210 has a top surface disposed above the lower portion 204b of the fin, and below the cladding channel 212. In some embodiments, distance T4 may range from about 10 nanometers to about 20 nanometers, and distance T5 may range from about 3 nanometers to about 8 nanometers. Distance T1, which includes the cladding channel and the upper fin portion 204a, may in some embodiments, range from about 10 nanometers to about 20 nanometers. In some embodiments, distance T2, which is the inter-fin distance, may range from about 16 nanometers to about 50 nanometers. In some embodiments for PFET devices, the cladding channel 212 may be comprised of SiGe (silicon germanium), or any other suitable material. In some embodiments for NFET devices, the cladding channel 212 may be comprised of a III-V compound, including, but not limited to, indium arsenide, gallium arsenide, indium gallium phosphide, gallium arsenide phosphide, InP (indium phosphide), InGaAs (indium gallium arsenide), or any other suitable material.

Figure 8:
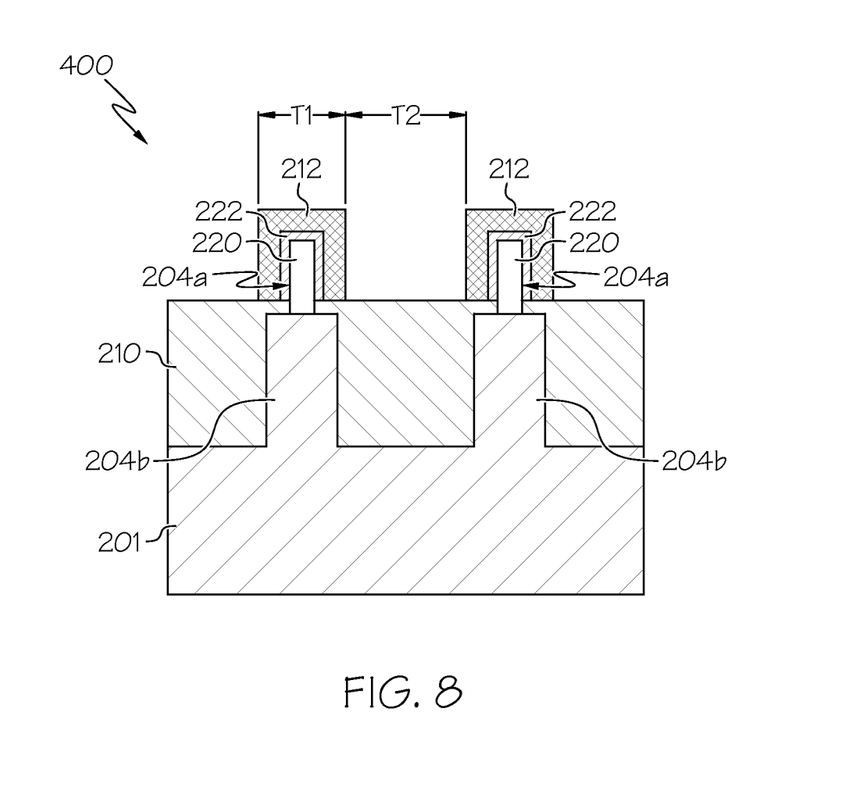
FIG. 8 is a semiconductor structure in accordance with alternative embodiments of the present invention.

FIG. 8 is a semiconductor structure 400 in accordance with another embodiment of the present invention. Semiconductor structure 400 is substantially similar to semiconductor structure 200, with the addition of an anti-punchthrough region 220 and a diffusion barrier 222. In the case of a PFET, the anti-punchthrough region 220 resides in the upper fin portion 204a, and is a doped region that is doped with N-type dopants such as arsenic or phosphorous, etc. In some embodiments, the dopant concentration may range from about 1E18 atoms per cubic centimeter (cm) to about 5E18 atoms per cubic cm. In some embodiments, the diffusion barrier 222 may comprise a carbon-doped silicon film (Si:C) or any other suitable material. In some embodiments, the anti-punchthrough region 220 is formed by ion implantation at the point in the formation process shown at FIG. 5, and the diffusion barrier 222 may be deposited at the point in the formation process shown at FIG. 6.

Figure 9:
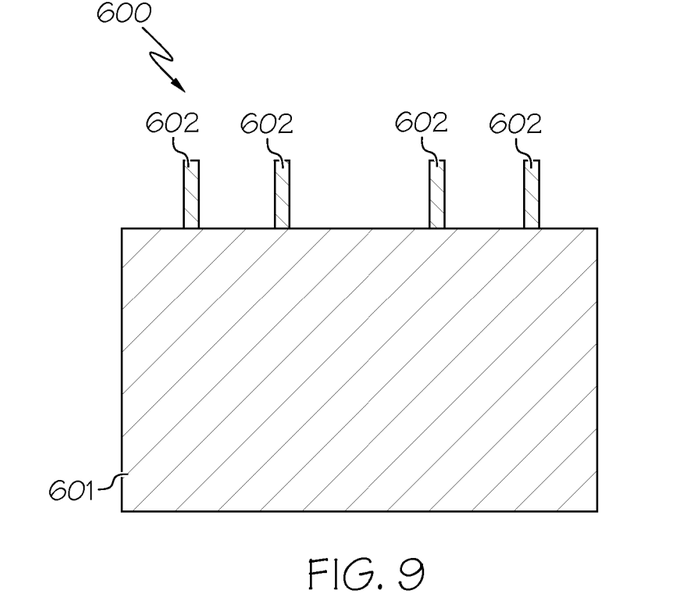
FIG. 9 is a semiconductor structure at a starting point for additional embodiments of the present invention.
Figure 10:
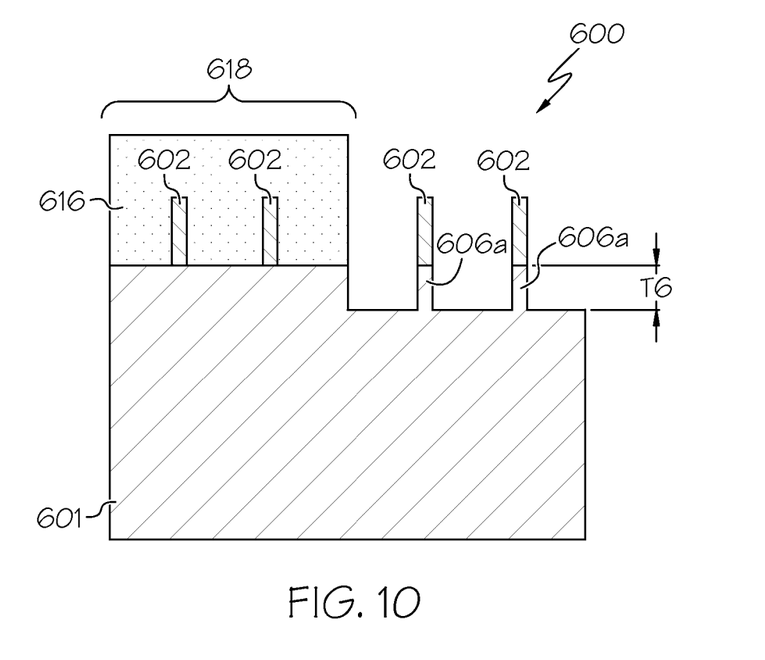
FIG. 10 is a semiconductor structure after a subsequent process step of forming the upper portion of the PFET fins.

FIG. 9 is a semiconductor structure 600 at a starting point for additional embodiments of the present invention. As shown, hardmask material regions 602 are formed on the substrate 601. In some embodiments, the hardmask material may be comprised of oxide, nitride or any other suitable material, and may be formed using industry-standard deposition and patterning techniques FIG. 10 is the semiconductor structure 600 after a subsequent process step of forming the upper portion 606a of PFET fins. This formation is achieved by masking the NFET side 608 with a photoresist or hardmask (such as, for example, oxide) 610 and etch to form the upper portion 606a of PFET fins. In some embodiments, T6 may range from about 20 nanometers to about 50 nanometers.

Figure 11:
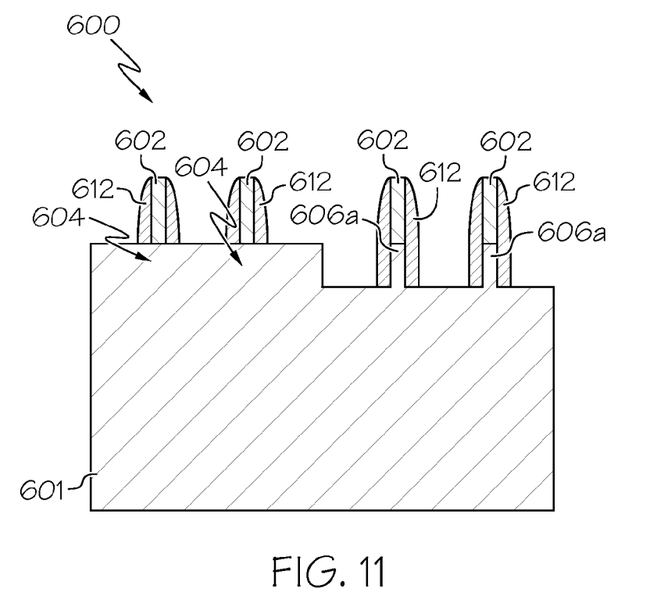
FIG. 11 is a semiconductor structure after a subsequent process step of spacer formation.

FIG. 11 is the semiconductor structure 600 after a subsequent process step of an additional spacer formation. The mask (or photoresist) 610 is removed from the NFET side 608. Spacers 612 are formed over the NFET hardmask material regions 602 and upper portion 606a of PFET fins. The spacers 612 may be comprised of silicon nitride, silicon oxide, any other suitable material, or any combination of layers of each.

Figure 12:
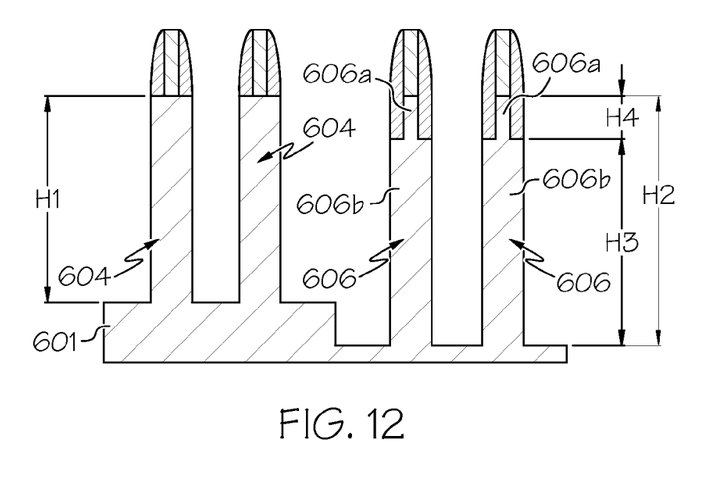
FIG. 12 is a semiconductor structure after a subsequent process step of performing a fin etch.

FIG. 12 is the semiconductor structure 600 after a subsequent process step of performing a fin etch. In some embodiments, this is an anisotropic etch. In some embodiments, this is a RIE (reactive ion etch). The PFET fins are multi-width, as the lower portion 606b is thicker than the upper portion 606a. The NFET fins 604 are uni-width (i.e. substantially the same width along the length of each fin). There is a height differential between the NFET fins 604 and the PFET fins (referred to as upper portion 606a and lower portion 606b). In some embodiments, height H1 may range from about 60 nanometers to about 200 nanometers. In some embodiments, height H2 may range from about 80 nanometers to about 220 nanometers. In some embodiments, height H3 may range from about 60 nanometers to about 200 nanometers. In some embodiments, height H4 may range from about 20 nanometers to about 50 nanometers.

Figure 13:
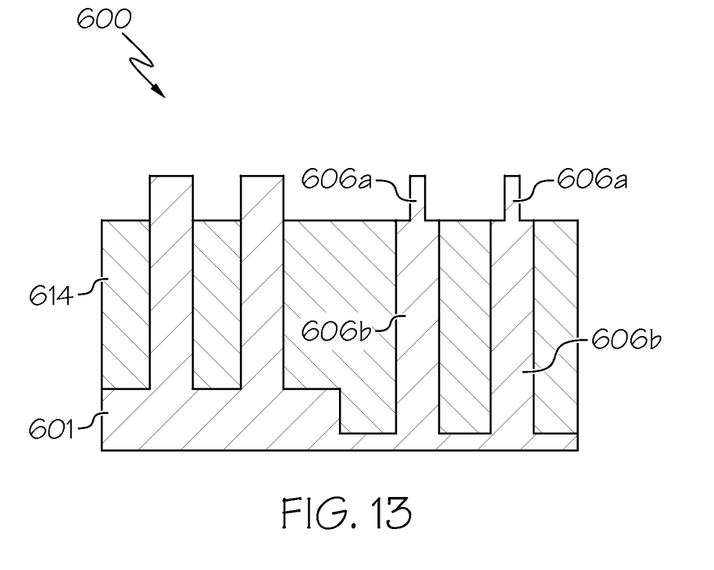
FIG. 13 is a semiconductor structure after a subsequent process step of depositing a dielectric layer.

FIG. 13 is a semiconductor structure after a subsequent process step of depositing a dielectric layer (ILD) 614. The ILD 614 is recessed by a selective etch process, such as chemical oxide removal (COR), wet etch, RIE, or any other suitable technique now known or hereafter developed.

Figure 14:
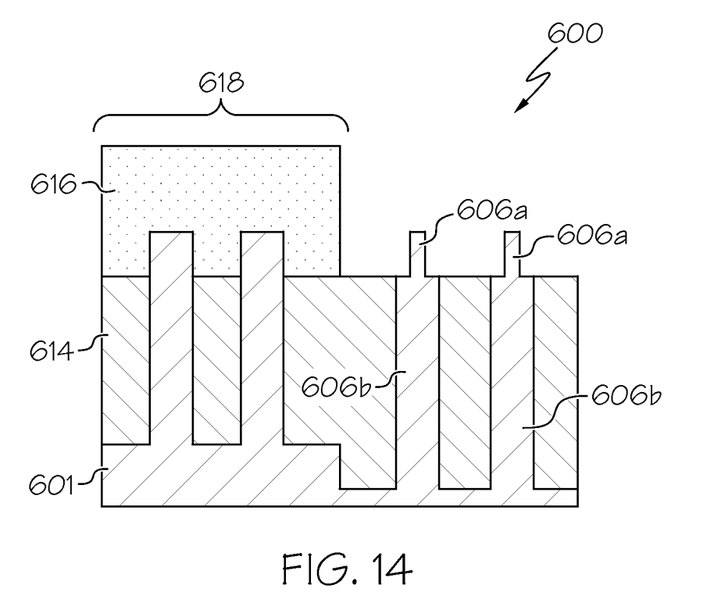
FIG. 14 is a semiconductor structure after a subsequent process step of depositing a mask layer over the nFET fins.

FIG. 14 is a semiconductor structure after a subsequent process step of depositing a mask layer 616 over the NFET side 618. The is accomplished by masking the NFET side 618 again with a photoresist or hardmask (such as oxide) 616 and etching the PFET fins to form the upper portion 606a of the PFET fins, while leaving the lower portion 606b of the PFET fins unchanged. The mask layer 616 serves as a protective layer during upcoming process steps.

Figure 15:
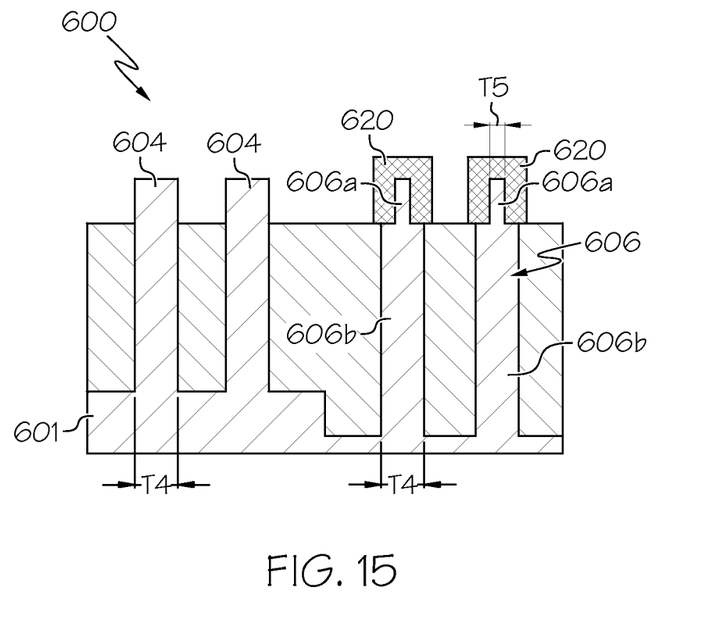
FIG. 15 is a semiconductor structure in accordance with additional embodiments of the present invention.

FIG. 15 is a semiconductor structure 600 after a subsequent processing step of depositing a cladding channel 620 over the upper portion 606a of multi-width PFET fins 606. In some embodiments, the cladding channel 620 may be comprised of Ge, SiGe or any other suitable material. The NFET fins 604 are uni-width fins without a cladding channel, having thickness (width) T4. The lower portion 606b of the PFET fins also may have a thickness T4. In still additional embodiments, the PFET fins may include the punch-thru stopper (anti-punchthrough region) and the diffusion barrier as shown in FIG. 8. In some embodiments, thickness T4 may range from about 10 nanometers to about 20 nanometers. In some embodiments, thickness T5 (upper portion 606a of the PFET fins) may range from about 3 nanometers to about 6 nanometers.

Figure 16:
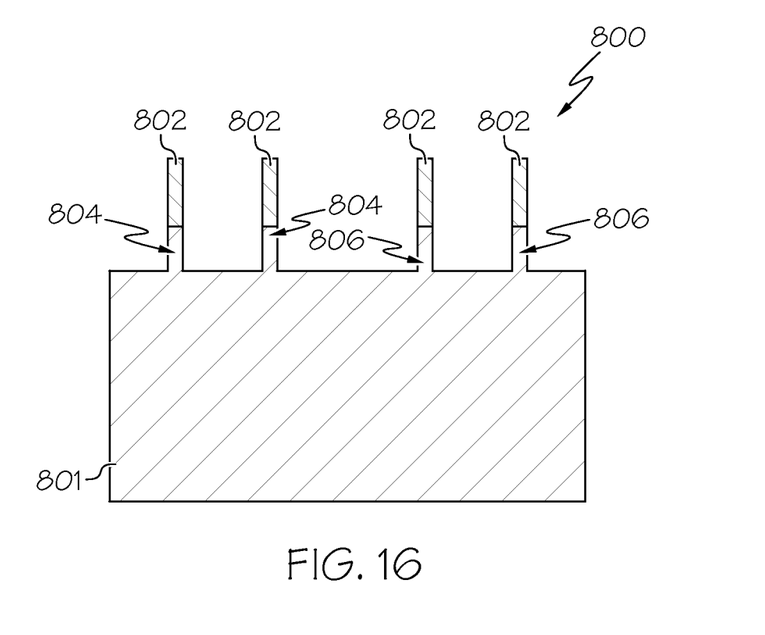
FIG. 16 is a semiconductor structure (based on the structure of FIG. 9) after a subsequent process step of performing a first fin etch.

FIG. 16 is yet another embodiment of the present invention. Therein shown is a semiconductor structure 800 (based on the structure of FIG. 9) after a subsequent process step of performing a first fin etch on a substrate 801 to form NFET fins 804 and PFET fins 806. Nitride hardmask regions 802 are formed over the fins 804 and 806. In some embodiments, nitride hardmask regions 802 may be formed by blanket deposition of a nitride layer prior to forming the fins 804 and 806, followed by a patterning process, or any other suitable method now known or hereafter developed.

Figure 17:
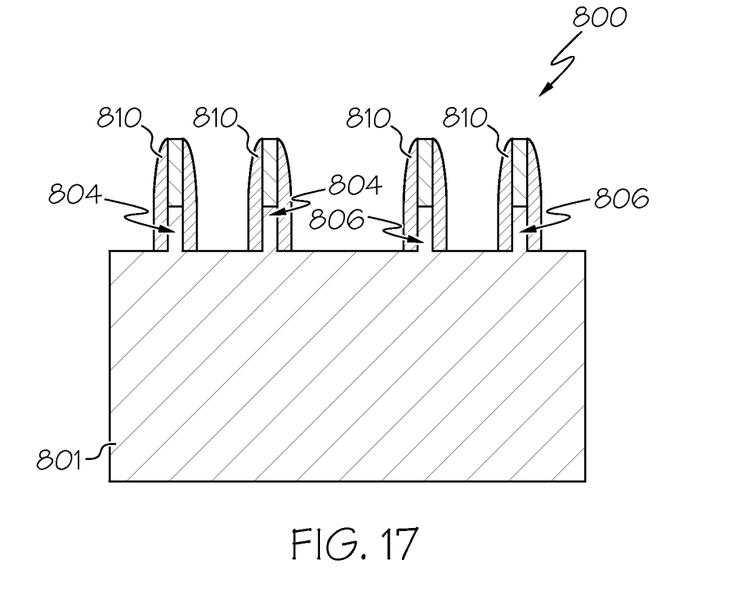
FIG. 17 is a semiconductor structure after a subsequent process step of spacer formation.

FIG. 17 is a semiconductor structure 800 after a subsequent process step of additional spacer formation. Additional spacers 810 may be comprised of silicon nitride, silicon oxide, any other suitable material, or a combination of layers of each.

Figure 18:
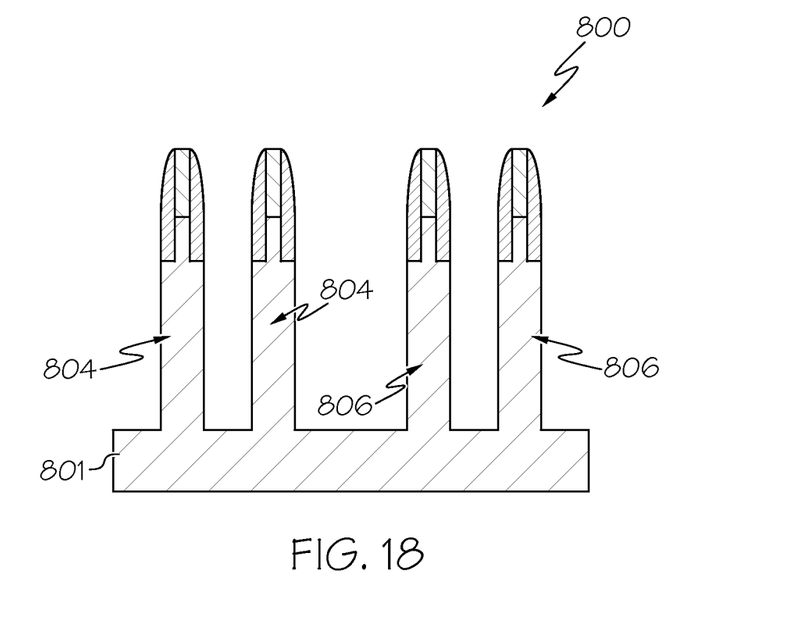
FIG. 18 is a semiconductor structure after a subsequent process step of performing a second fin etch.

FIG. 18 is a semiconductor structure 800 after a subsequent process step of performing a second fin etch. Each of the NFET fins 804 and the PFET fins 806 are multiwidth (i.e. staircase) fins.

Figure 19:
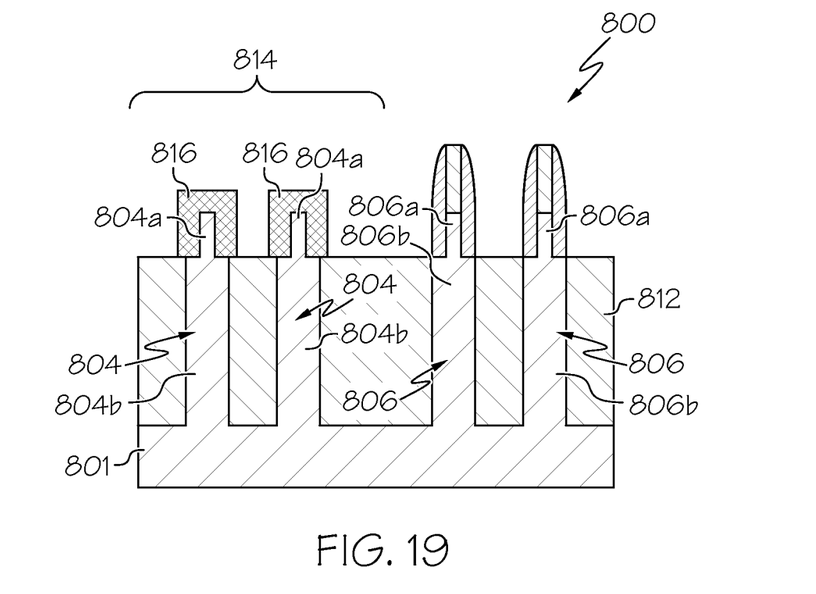
FIG. 19 is a semiconductor structure after subsequent process steps of depositing a dielectric layer and forming a cladding channel on the nFET fins.

FIG. 19 is a semiconductor structure 800 after subsequent process steps of depositing an interlayer dielectric layer (ILD) 812 and forming a cladding channel 816 on the upper portion 804a of the NFET fins 804. In some embodiments, the interlayer dielectric 812 may be comprised of silicon oxide. The ILD 812 is deposited, and then planarized (e.g. with CMP) and recessed down to just above the lower portion 804b and 806b of the fins. Next, the PFET fins 806 were masked and the spacers 810 removed from the NFET side 814. The NFET cladding channel 816 is then deposited over an upper portion 804a of the NFET fins 804. In some embodiments, the NFET cladding channel may be comprised of a III-V compound, including, but not limited to, indium arsenide, gallium arsenide, indium gallium phosphide, gallium arsenide phosphide, InP (indium phosphide), and InGaAs (indium gallium arsenide) and/or any other suitable material.

Figure 20:
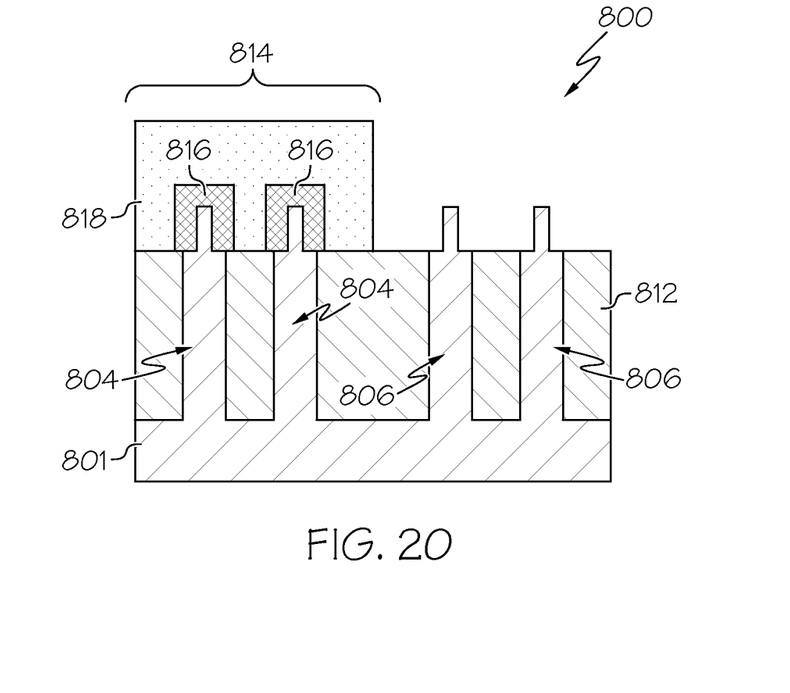
FIG. 20 is a semiconductor structure after subsequent process steps of depositing a mask layer on the nFET fins.

FIG. 20 is a semiconductor structure 800 after subsequent process steps of depositing a mask layer 818 on the NFET side 814. The mask layer serves as a protective layer during upcoming process steps.

Figure 21:
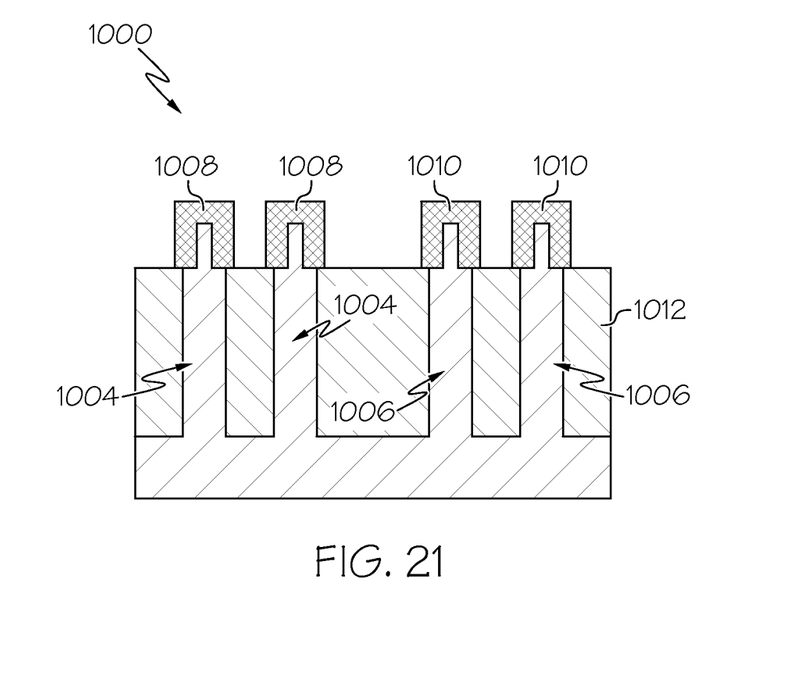
FIG. 21 is a semiconductor structure after subsequent process steps of forming a PFET cladding channel and removing the mask layer on the nFET fins.

FIG. 21 shows a semiconductor structure 1000 in accordance with still yet another embodiment of the present invention, in which both the NFET fins 1004 and the PFET fins 1006 are multiwidth, each having a cladding channel. The conformal NFET cladding channel is shown at 1008 and the conformal PFET cladding channel is shown at 1010. In some embodiments, the PFET cladding channel may be SiGe or any other suitable material. In some embodiments, the PFET cladding material may be comprised of $Si_xGe_y$, where $0<x$, and $y<1$). In some embodiments, the conformal NFET cladding channel is comprised of a III-V compound. The interlayer dielectric 1012 may be comprised of silicon oxide, or other suitable dielectric material.

Figure 22:
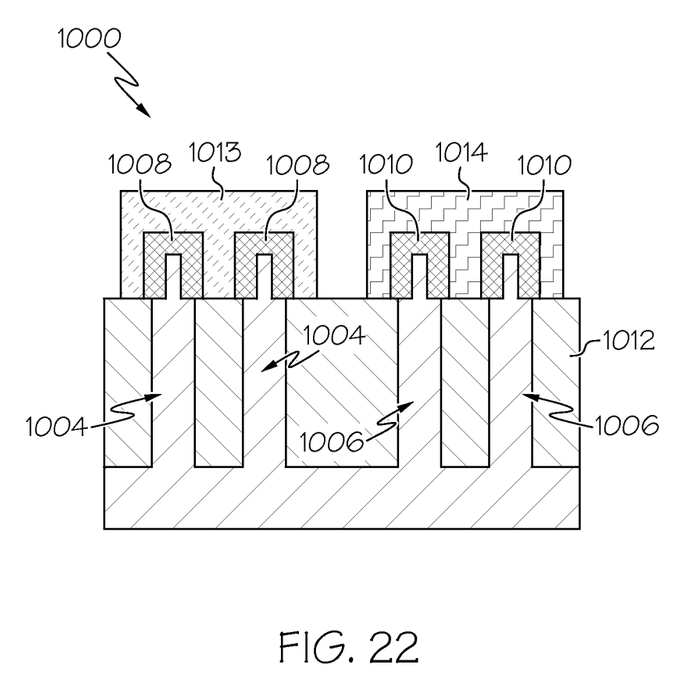
FIG. 22 is a semiconductor structure in accordance with additional embodiments of the present invention.

FIG. 22 is a semiconductor structure after formation of gates 1013 and 1014. Gates 1013 and 1014 are formed over the conformal NFET cladding channel 1008 and the conformal PFET cladding channel 1010 by conventional processes in the art. In some embodiments, the gates 1013 and 1014 are formed by a replacement metal gate (RMG) process. The NFET gate 1013 may be comprised of a different material than the PFET gate 1014.

Figure 23:
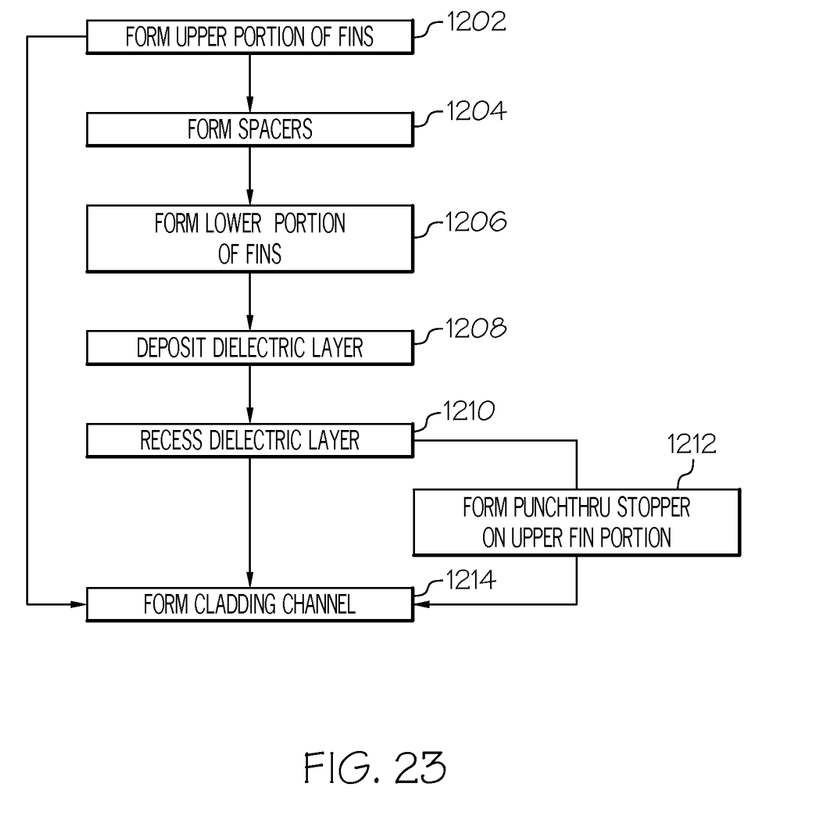
FIG. 23 is a flowchart indicating process steps for embodiments of the present invention.

FIG. 23 is a flowchart indicating process steps for embodiments of the present invention. At 1202, an upper portion of the fins is formed. At 1204, spacers are deposited. At 1206, a lower portion of the fins is formed. At 1208, a dielectric layer is deposited. At 1210, a dielectric layer is recessed. At optional step 1212, a punch thru stopper (anti-punchthrough region) on the upper portion of the fin is formed. "Optional", as used herein, means that some embodiments include the step, and other embodiments lack the step. At 1214, a cladding channel is formed. From this point forward, industry-standard processes may be used to complete the fabrication of the integrated circuit. This may include formation of additional dielectric layers, via layers, and metallization layers, as well as packaging processes.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure comprising:
   a semiconductor substrate having a plurality of fins formed thereon, wherein at least one fin of the plurality of fins is comprised of a lower portion and an upper portion, wherein the lower portion has a first constant thickness and wherein the upper portion has a second constant thickness, and wherein the first thickness is greater than the second thickness, and wherein the at least one fin has a staircase profile;
   a conformal cladding layer disposed on the upper portion of the at least one fin of the plurality of fins; and
   a dielectric layer disposed on the semiconductor structure, wherein a portion of the dielectric layer is disposed in a gap between the lower portion of the at least one fin of the plurality of fins and the conformal cladding layer.

2. The semiconductor structure of claim 1, wherein the conformal cladding layer is comprised of silicon germanium.

3. The semiconductor structure of claim 1, wherein the conformal cladding layer is comprised of a III-V compound.

4. The semiconductor structure of claim 3, wherein the conformal cladding layer comprises a material selected from the group consisting of indium phosphide and indium gallium arsenide.

5. The semiconductor structure of claim 2, wherein the upper portion of each fin of the plurality of fins comprises a doped region.

6. The semiconductor structure of claim 5, further comprising a diffusion barrier disposed over the doped region.

7. The semiconductor structure of claim 6, wherein the diffusion barrier comprises a carbon-doped silicon film.

8. A semiconductor structure comprising:
   a semiconductor substrate having a plurality of NFET fins formed thereon and a plurality of PFET fins formed thereon, wherein each fin of the plurality of PFET fins is comprised of a lower portion and an upper portion, wherein the lower portion has a first constant thickness and wherein the upper portion has a second constant thickness, and wherein the first thickness is greater than the second thickness;

a conformal PFET cladding layer disposed on the upper portion of each fin of the plurality of PFET fins; and a dielectric layer disposed on the semiconductor structure, wherein a portion of the dielectric layer is disposed in a gap between the lower portion of each fin of the plurality of PFET fins and the conformal PFET cladding layer.

9. The semiconductor structure of claim 8, wherein the conformal PFET cladding layer is comprised of silicon germanium.

10. The semiconductor structure of claim 8, wherein each fin of the plurality of NFET fins is comprised of a lower portion and an upper portion, wherein the lower portion has a first thickness and wherein the upper portion has a second thickness, and wherein the first thickness is greater than the second thickness.

11. The semiconductor structure of claim 10, further comprising a conformal NFET cladding layer disposed on the upper portion of each fin of the plurality of NFET fins.

12. The semiconductor structure of claim 11, wherein the conformal NFET cladding layer is comprised of a III-V compound.

* * * * *